(12) United States Patent
Bromberger

(10) Patent No.: US 7,853,902 B2
(45) Date of Patent: Dec. 14, 2010

(54) METHOD FOR DESIGNING A CIRCUIT, PARTICULARLY HAVING AN ACTIVE COMPONENT

(75) Inventor: Christoph Bromberger, Hoelderlinstr. 10, D-74074 Heilbronn (DE)

(73) Assignee: Christoph Bromberger, Heilbronn (DE)

( * ) Notice: Subject to any disclaimer, the term of this patent is extended or adjusted under 35 U.S.C. 154(b) by 0 days.

(21) Appl. No.: 11/401,351

(22) Filed: Apr. 11, 2006

(65) Prior Publication Data

US 2006/0230365 A1 Oct. 12, 2006

(30) Foreign Application Priority Data

Apr. 11, 2005 (DE) .................. 10 2005 016 459

(51) Int. Cl.
*G06F 17/50* (2006.01)
(52) U.S. Cl. ............................. 716/2; 716/1
(58) Field of Classification Search ............ 716/2, 716/5, 4, 1
See application file for complete search history.

(56) References Cited

U.S. PATENT DOCUMENTS 5,528,509 A * 6/1996 Sawai et al. .................. 716/1
6,266,629 B1 * 7/2001 Mallavarpu et al. .......... 703/13
2003/0101418 A1 * 5/2003 Draxler et al. ................ 716/1

FOREIGN PATENT DOCUMENTS

DE 697 27 110 T2 6/2004

OTHER PUBLICATIONS

"Microelectronic Circuits", by Adel S. Sedra & Kenneth C. Smith, Fith edition @2004.*
"Impedance Matching and the Smith Chart: the Fundamentals", http://www.maximic.com/appnotes.cfm/appnote_number/742/ , Mar. 23, 2001.*
Harmonic Balance Analysis of Output Impedance Matching in Active RF/Microwave Frequency Multipliers, Johnson & Branner , IEEE @2004.*
"The Smith Chart", http://mysite.du.edu/~jcalvert/tech/smith.htm, by J Clavert , Aug. 16, 2003.*
"Average Small-Signal Analysis of Power Factor Correctors Controlled by Conduction Angle", by J. Sebastian, A. Fernandez, P. Villegas, J. Garcia, and M. Hernando, @2003 IEEE.*

* cited by examiner

*Primary Examiner*—Thuan Do
*Assistant Examiner*—Nha T Nguyen
(74) *Attorney, Agent, or Firm*—Muncy, Geissler, Olds & Lowe, PLLC

(57) ABSTRACT

A method for designing a circuit, particularly having an active component, preferably a high-frequency circuit, wherein: (a) a plurality of load lines is determined at least approximately; (b) a course of a small-signal parameter along each load line is determined at least approximately; (c) a region of each load line is determined as a load line subset, distinguished by a characteristic property dependent on the small-signal parameter; and (d) a large-signal parameter, assigned to the load line, is determined at least approximately from the course of the small-signal parameter within the region.

22 Claims, 5 Drawing Sheets

METHOD FOR DESIGNING A CIRCUIT, PARTICULARLY HAVING AN ACTIVE COMPONENT

This nonprovisional application claims priority under 35 U.S.C. §119(a) on German Patent Application No. DE 102005016459, which was filed in Germany on Apr. 11, 2005, and which is herein incorporated by reference.

BACKGROUND OF THE INVENTION

1. Field of the Invention

The present invention relates to a method for designing a circuit, particularly having an active component, in, for example, a high-frequency circuit.

2. Description of the Background Art

According to the conventional art, for the design of electronic circuits, means are known for dimensioning electronic components and establishing suitable operating points for electronic components. Methods, which depict circuit parameters at the reflection factor level, mainly in the passive part of the reflection factor level, called a Smith chart hereafter, namely, particularly in form of isohypses, play a special role here. Thus, for example, in the input and output Smith chart of an active component at a given operating point, lines are drawn as loci of a constant power gain depending on the input or output reflection factor. The Smith chart per se as a reflection factor diagram is hereby first a small-signal method.

Essential parameters for a power amplifier are the linear output power, quantified hereinafter by the compression point, $P_{-1dB}$, the power added efficiency, designated as "PAE" in the following text, and the amount of the power gain, measured on a logarithmic scale, characterized by G (gain).

Smith charts with drawn isohypses, for example, of a constant Rollet's k factor, permit a designer to reach conclusions on the functionality at a considered operating point of the component. The isohypses are typically generated in an automated manner.

Design technology, moreover, allows the automatic generation of isohypsic regions for quantities, which can be derived in the output characteristic field from the local circuit properties. With the aid of the postprocessor for "Advanced Design System" (ADS) from Agilent, for example, isohypses of this type can be automatically generated with commands such as contour(max_gain(S)).

These numerical calculations require considerable effort to determine precisely the required properties of the amplifier or an active component.

SUMMARY OF THE INVENTION

It is therefore an object of the present invention to provide an advanced automated method to support a designer, which is used to design a circuit, particularly having an active component, preferably a high-frequency circuit.

Accordingly, a method is provided for designing an electrical circuit. In this method,

- a plurality of load lines are determined at least approximately,
- and, in addition, a course of a small-signal parameter along each load line is determined at least approximately;
- a region of each load line is determined as a load line subset, distinguished by a characteristic property dependent on the small-signal parameter; and
- a large-signal parameter, assigned to the load line, is determined at least approximately from the course of the small-signal parameter within the region.

For the approximate determination, the small-signal parameter can be estimated, for example, by using a mathematical approximation procedure. The load line in the output characteristic field of an active element in most technically important cases is a self-contained curve (only the so-called chaotic systems are an exception to this). This type of load line can enclose, for example, a finite region of the output characteristic field. A load line, however, can also collapse onto a straight-line section. In analogy to the behavior of an ohmic resistance at a source with a real internal resistance, in this case the term "straight resistance line" or a "straight (ohmic) load line" is used. Whereas a small-signal parameter emerges from an approximated linear behavior of an active component at an operating point, the large-signal parameter considers in addition nonlinearity, which is caused by the transfer characteristic of the active component.

An advantageous embodiment of the invention provides that to determine the plurality of load lines a first set, containing a first number of supporting operating points, is selected and each supporting operating point is assigned a set containing a second number of load lines.

In addition or alternatively to a Smith chart, this type of approach, originating from the output characteristic field, due to the narrow, intuitively understandable association with the behavior of a component or circuit with large-signal modulation, enables a simplified analysis.

In a further embodiment of the method, the plurality of load lines is determined, wherein

- a first set of supporting operating points is determined,
- at each supporting operating point, an effective output resistance for a given matching condition at the input is determined, and
- at each supporting operating point, a straight-line slope is determined as an absolute square of the effective output impedance, divided by twice the real part of the effective output impedance, as well as a load line as a straight line with the determined straight-line slope through the supporting operating point; "effective output impedance" here means the output impedance regarded as effective on the output side at the given input matching condition.

Furthermore, each load line as output impedance is preferably assigned the complex conjugate of the effective output impedance.

The movement in the output characteristic field, for example, of a collector of a bipolar transistor in a basic circuit is determined by a parallel connection of the output impedance of the bipolar transistor with the input impedance of the load. In the case of output-side power matching, this movement occurs, at least locally, on an ohmic load line with the straight-line slope. The use of this straight-line slope at the start of the described further embodiment of the method as the slope of the load lines brings the conditions, to be found later, for an approximate optimal operation of the component or circuit "into the vicinity" of conditions for operation with a maximum power gain.

In a further embodiment of the method, the plurality of load lines is determined, wherein

- a first set of supporting operating points is determined,
- at each supporting operating point, an effective output impedance for a given matching condition at the input is determined,
- at each supporting operating point, a straight-line slope is determined as an absolute square of the effective output impedance, divided by twice the real part of the effective output impedance, at each supporting operating point, a varied straight-line slope and self-consistently a load impedance are determined, said load impedance at which a parallel connection a) first, of the effective output impedance of the active component at the supporting operating point at a given matching condition at the input of the active component, and b) second, of the load impedance, has a real value equal to the varied straight-line slope, as well as a load line as a straight line with the varied straight-line slope is selected by the supporting operating point;

furthermore, each load line is assigned the self-consistently determined output impedance as the output impedance.

In optimizing component behavior, it is frequently appropriate to deviate in a controlled way from operating conditions, leading to a maximum power gain, which is advantageously achieved by the present further embodiment of the method.

In a further embodiment of the method, the variation of the straight-line slope occurs in such a way that the straight-line slope at which the region has the greatest expansion is selected as the varied straight-line slope.

In a further embodiment of the method, the first set of supporting operating points is selected as a set of all current-voltage pairs with a voltage equal to an integer multiple of a voltage resolution within a preselected output voltage range and a current, which, lying within the preselected output current range, represents an integer multiple of the preselected current resolution.

Within the scope of an essential further embodiment of the method, the small-signal parameter is selected from the parameters:

maximum achievable power gain,
maximum stable power gain,
maximum achievable power gain with freedom from reflection at the input,
maximum stable power gain with freedom from reflection at the input,
maximum achievable power gain with minimization of the noise ratio,
maximum stable power gain with minimization of the noise ratio.

Within the scope of an essential further embodiment of the method, the small-signal parameter is the power gain, resulting along the load line, at input and output impedances, which fulfill one of the conditions at the supporting operating point:

the input and output impedances maximize the achievable power gain,
the input and output impedances maximize the stable achievable power gain,
the input and output impedances maximize the achievable power gain with freedom from reflection at the input,
the input and output impedances maximize the stable achievable power gain with freedom from reflection at the input,
the input and output impedances maximize the achievable power gain with minimization of the noise ratio,
the input and output impedances maximize the stable achievable power gain with minimization of the noise ratio,
the input and output impedances are otherwise expediently selected for operation at the supporting operating point.

A preferred further embodiment of the invention provides that for determining the region of each load line, first a significant value, particularly an at least local extremum, of the value of the small-signal parameter is determined along the load line, and selected as the region is the connected section, containing the at least local extremum, of the load line, the section in which the value the small-signal parameter deviates from the at least local extremum by no more than a specified factor, for example, 3 dB.

Large-signal parameters result as the integral of the small-signal parameters, corresponding to these, of the considered component or circuit over the large-signal output characteristic. If, within the scope of the circuit design, an operating point is found, at which a large-signal parameter depends to the lowest extent possible on the modulation, then this object is achieved, inter alia, in that an output characteristic is selected along which the small-signal parameter, whose integral value produces the large-signal parameter, has the lowest possible variation.

For the purpose of the approximate determination of this type of characteristic, first, regions along the at least approximate load lines are advantageously sought, the regions within which the variation of the considered small-signal parameter being limited in a suitable way.

A further embodiment of the invention provides that the region of each load line is determined as the section of the load line maximum expansion, the section in which the value of the small-signal parameter can be described with a given accuracy by a determined curve course, for example, a symmetric paraboloid course.

Advantageously, not a lowest possible variation but a desired nonconstant course of a large-signal parameter can be realized over the deflection. An example of this is predistorting prestages, used to compensate modulation dependence of the gain of the main amplifier stage. Because at suitable operating points of the lowest possible distortion of the main amplifier its small-signal gain frequently declines with the square of the deflection. This facilitates in particular the design of the predistorting prestages.

A further embodiment of the invention provides that at least one of the limits of the region of each load line is determined by, for example, a quadratic extrapolation up to least a point at which the extrapolated value of the small-signal parameter has a specific property.

Particularly, due to inadequacies of the models describing, for example, bipolar transistors, the statically calculated power gain increases in the voltage range shortly before the base-emitter breakdown. This permits a deduction of such model artifacts in the search for suitable operating points.

A further embodiment of the invention provides that the position of the maximum of the small-signal parameter along the load line can be selected as the region.

An aspect of the invention comprises that the large-signal parameter assigned to the load line is determined at least approximately from the course of the small-signal parameter within the region, by selecting preferably the value of the large-signal parameter at the position of the maximum of the small-signal parameter along the load line. Alternatively, the average value or an integral value can also be used as the value for the large-signal parameter.

A further embodiment of this aspect of the invention provides that one or more of the following parameters are selected as the large-signal parameter:

intermodulation product of the order n, particularly with n=2 or n=3;
harmonic distortion of the n-th order, particularly with n being equal to 2 to 5; or
distortion factor.

With a particularly small deflection of a component or circuit around an operating point, at which the gain has a local extremum, an especially low-distortion operation results. By taking into account the course of the small-signal parameter along load lines, such local extrema can be determined particularly in an advantageous and automatable manner and hereby of all operating points of an at least approximate load line can be filtered out that enable an especially low-distortion operation.

In a further embodiment of the method, an operating point within the region can be determined and the determined large-signal parameter is assigned to the determined operating point. To determine the operating point, the position of the operating point can be determined from the position and expansion of the region. Hereby, the position of the operating point is selected equal to the position of the geometric centroid of the region.

According to another embodiment of the invention, it is provided that of the determined operating points, a distinguished operating point with the best desired values of all values, assigned to the determined operating points, for the determined large-signal parameter can be used as an approximate solution for an operating point optimizing the value of the large-signal parameter, and the value, assigned to the distinguished operating point, of the determined large-signal parameter as the approximate solution for the optimal value of the large-signal parameter.

A search for a distinguished operating point, optimizing the value of the determined large-signal parameter, of the considered active component or circuit can be limited to a predefined range of output voltages and/or output currents, particularly collector currents. Especially, in the laying out of battery-operated components or circuits, the designer is narrowly limited in the choice of the supply voltage. In such cases in particular, the circuit design is supported by the present further embodiment.

Another aspect of the invention is a graphic presentation of the results, which can be displayed, for example, on a display, for example, of a measuring device or a computer system. Accordingly, an advantageous further embodiment of this aspect of the invention provides that several determined values of the large-signal parameter are graphically presented as a function of the specifically assigned operating point for several voltage values and current values, preferably of an initial characteristic field.

In order to optimize the graphic presentation, it is provided in an embodiment that the graphic presentation occurs for at least one selected page of a figure, particularly if the figure of the determined values of the large-signal parameter at the operating points is multivalued.

In plotting large-signal parameters for load lines, which cover a broad range of load conditions, the case can arise that one and the same point of the output characteristic field optimizes the value of the large-signal parameter in several regions of different characteristics. In general, hereby, however, the optimal values of the large-signal parameter are different for the different regions. In the interest of the clarity of the presentation, it is particularly advantageous in such cases to limit the presentation to a selected sheet of the optimal values of the large-signal parameter. The graphic presentation occurs especially preferably in the form of isohypses of the determined values of the large-signal parameter over the operating points.

For support during the design of the electronic circuits, it is purposeful in a preferred embodiment that an operating point, maximizing a power added efficiency of an active component or an amplification circuit, is determined at least approximately, in that first for each operating point from a set of supporting operating points and for each load impedance from a set of load impedances along a load line, which approximates a load line through the operating point to the load impedance and to an input impedance, expediently selected at each operating point for the load impedance, a course of the small-signal power gain is determined as a course of a small-signal parameter. Moreover, an at least local maximum of the small-signal power gain is determined as a significant value along each load line.

In another embodiment, the operating point can be determined within the region in such a way, particularly estimated in such a way that at this operating point the power added efficiency within the region is maximized. Moreover, the maximum power added efficiency within the region is determined, especially estimated, as a function of an expansion of the connected region and the position of the operating point, and the maximum power added efficiency determined, especially estimated, in this way within the region is assigned to the operating point determined, particularly estimated in this way.

To improve further this aspect of the invention, it is provided that of all operating points determined in this way, approximately maximizing the power added efficiency, within the specific regions, the one with a maximum determined power added efficiency is selected as an estimate for an operating point maximizing the power added efficiency.

Another further embodiment of this aspect specifies that the greatest of the maximum power added efficiencies within the region is selected as the estimate for the maximum power added efficiency.

Another embodiment of the invention provides that of the source/load impedance pairs, the pair that leads to that load line whose subset is a region, within which an operating point, estimated in this way and approximately maximizing the power added efficiency within the region, is used as an estimated source/load impedance pair, approximately maximizing the power added efficiency at the operating point estimated in this way.

An essential parameter for the design of amplifier circuits is the efficiency as the ratio of the output power relative to the standby power of the amplifier. In CAD technology, as in measuring technology, a determination of the efficiency-optimized operating conditions occurs in particular by load pull and/or source pull methods with a retained operating point. Whereas the effort to be exerted for this purpose greatly impedes an analysis of several or many operating points, the aforementioned method of the preceding further embodiments permits the search for efficiency-optimizing operating conditions in the output characteristic field, as well as within the space of the load and source impedances, in the case of CAD methods in a numerically effective manner, and in the case of the technical measurement determination with a much lower effort.

According to a further embodiment, it is provided that the set of supporting operating points is constructed according to the instructions:

Selection of a first number, which, for example, may be equal to a number of 100, Selection of a first point, which, for example, may be identical to the origin of an output characteristic field of the considered component or amplifier circuit, Selection of a second point in the output characteristic field of the considered component or amplifier circuit, said second point which, for example, may be the point for the maximum reverse voltage, permissible across the component or amplifier circuit, and for the maximum current permissible across the component or amplifier circuit, Selection of a segment between the first point and the second point in the output characteristic field, said segment which, for example, may be part of a straight line, Division of the segment into a first number of points, said division which can occur, for example, equidistant, Selection of the totality of the first number of points as the set of supporting operating points.

It is provided thereby that the set of load impedances is constructed according to the instructions:

Selection of a second number, which, for example, may be equal to a number of 300, Selection of a second number of load reflection factors, for example, in such a way that the load reflection factors cover roughly and uniformly the passive part of the reflection factor level, Determination of the load impedance belonging to a load reflection factor from the second number of load reflection factors, Selection of the totality of the second number of the load impedances, belonging to one of the load reflection factors, as the set of load impedances.

In an embodiment, the selection of the set of load lines can be provided as a totality of the ohmic load lines through the operating point for the ohmic part of any desired factor from the second number of load reflection factors, and for an input impedance expedient at the given operating point and the given load impedance.

In an embodiment of the invention, a selection of an input impedance, expedient at the considered load impedance and the considered operating point, occurs as the selection of the input impedance that corresponds to a source reflection factor, which represents the complex conjugate of the input reflection factor seen at the considered load impedance and the considered operating point at the input of the active component or amplifier circuit.

In another embodiment of the invention, a selection of an input impedance, expedient at the considered load impedance and the considered operating point, occurs as the selection of the input impedance that corresponds to a source reflection factor, which is equal to the input reflection factor seen at the considered load impedance and the considered operating point at the input of the active component or amplifier circuit.

In an again different embodiment of the invention, a selection of an input impedance, expedient at the considered load impedance and the considered operating point, occurs as the selection of the input impedance that minimizes the noise ratio of the active component or amplifier circuit at the considered load impedance and the considered operating point.

According to another embodiment of the invention, a selection of the second number of load reflection factors occurs in such a way that a load reflection factor with an ordinal number is selected as the product of first, the root of the quotient of the ordinal number and the second number and second, the root, exponented to the base of Euler's number e, of the negative of the product of four times the circle constant π and the ordinal number for each natural number smaller than the second number or equal to the second number as an ordinal number.

By means of such a selection, the passive part of the load reflection factor level can be covered sufficiently uniformly with the aid of a single control variable.

An embodiment constitutes an estimate of the maximized power added efficiency for one of the second operating points, maximizing the power added efficiency over a region of the load line, and a load line from the expansion of the connected region, as well as the position of the second operating point, according to the instructions:

Selection of a first boundary point, maximizing the square of the difference between a current at the second operating point and a current at one of the points of the connected region with a higher current than the current at the second operating point, Selection of a second boundary point, maximizing the square of the difference between the current at the second operating point and the current at one of the points of the connected region with a lower current than the current at the second operating point, as well as Estimation of the power added efficiency from the expansion of the connected region and the position of the second operating point as half of the absolute value of the product of, first, the quotient of the difference and the sum of the voltage values at the two boundary points, and, second, the quotient of the difference and the sum of the current values at the two boundary points.

A further embodiment of the invention provides that for the purpose of determining the power gain for the load impedance and the input impedance along the load line, an output characteristic field with a given resolution in current and voltage is determined once before use of the method, and the small-signal parameters are determined at each considered point of the output characteristic field. This further embodiment permits an implementation of the method especially simple numerically or in terms of measurement technology.

Before maximum values of the power gain for the load impedance and the input impedance along the load line are determined, numerically determined values of the power gain for load impedance and input impedance along the load line of the method are smoothed.

Furthermore, before the determination of the target values, the determined values for maximum power added efficiencies within the regions, plotted versus output current and output voltage, are smoothed.

To enable a rapid review of the results, an advantageous embodiment of the invention provides that a graphic presentation occurs by plotting the determined power added efficiencies versus voltages and currents after division into classes, preferably with color coding.

Furthermore, additional values are determined belonging to the determined operating points, approximately maximizing the power added efficiency within the specific regions, and to the estimated source/load impedance pairs, approximately maximizing the power added efficiencies at the operating points estimated in this way. Such values are preferably the small-signal power gain, the output power, an effective input reflection factor, and/or an effective output reflection factor.

Additional small- and/or large-signal parameters for the second operating points and the source and load reflection factors, each optimizing the estimated power added efficiencies at the operating points, such as for example, the compression point, the small-signal gain, or the noise ratio, can be shown graphically, particularly in the form of smoothed isohypses.

In determinating expedient operating conditions of electronic components or circuits, the designer is often challenged to weigh different, contradictory target parameters against each other. By the present further embodiment, the plotting of electrical parameters, in addition to the target parameters of the method according to the invention, for example, in form of isohypses, provides an advantageous automatable support in this "weighing."

The determination of the operating parameters, optimizing the considered large-signal parameters, of the active components or amplifier circuits can be limited to two operating points unconditionally stable at one or more considered frequencies.

The determination of the operating parameters, optimizing the considered large-signal parameters, of the active components or amplifier circuits can be limited to operating points at which at the considered frequency at least the input or output reflection factor, according to the contribution, is greater than one. The last two further developments are thereby used preferably for constructing oscillators or amplifiers.

A preferred further embodiment of the invention provides that the plurality of load lines for operating points, at which the active component or the amplifier circuit is unconditionally stable at the considered frequency, is selected according to the instructions:

Selection of a third number, which, for example, may be selected as equal to the number 30, as well as a lower and upper threshold, said lower threshold which may be selected, for example, as the number 0.5 and said upper threshold, for example, as the number 2, Determination of an ohmic output resistance, effectively active at the load and source impedances maximizing the power gain, as an absolute square of the load impedance maximizing the power gain, divided by the double real part of the load impedance maximizing the power gain, Division of the region from the product of the lower threshold and the effectively active ohmic output resistance to the product of the upper threshold and the effectively active ohmic output resistance into a third number of, for example, equidistant resistance values, For each resistance value from the third number of resistance values, determination of a load reflection factor and a source reflection factor, which fulfill the condition that the source reflection factor is the complex conjugate of the effective input reflection factor and that a parallel connection of the load resistance, belonging to the load reflection factor, with the output resistance of the considered active component or circuit produces a purely ohmic resistance from the quantity of the resistance value, provided such a load reflection factor/source reflection factor pair exists for this resistance value, Selection of the plurality of load lines as the set of ohmic load lines through the operating point for those effective resistance values from the third number of resistance values for which such load reflection factors and source reflection factors exist, and, if applicable, selection of the load and source impedances in each case associated with the load lines and operating points as the load and/or source impedances belonging to the load reflection factors and source reflection factors determined above.

If a load line of an output characteristic collapses to a straight resistance line, the output current and output voltage of the active element are in phase, the element which produces no reactive power but exclusively real power. A special case of this is the so-called "power matching": With the aid of a matching network, the input resistance of the load is transformed into the complex conjugate of the output resistance of the active element.

The slope of the straight ohmic load lines is hereby determined from the parallel connection of the (effective) output resistance of the active element and of the input resistance of the load from the (effective) output resistance as an absolute square, divided by twice the real part of the (effective) output resistance.

The power matching in particular represents a technically important special case insofar as it is possible to maximize the power gain of an active elements by the power matching. The further embodiment of the method described here defines the approximate operating conditions of an active component or circuit, which maximize the power added efficiency under the boundary condition of power matching at the input.

Another further embodiment of the invention provides that the plurality of load lines for operating points at which the active component or the amplifier circuit at a considered frequency is unconditionally stable, is selected according to the instructions:

Selection of a third number, which, for example, may be selected as equal to the number 30, as well as a lower and upper threshold, said lower threshold which may be selected, for example, as the number 0.5 and said upper threshold, for example, as the number 2, Determination of load/source impedance pairs for the operating points, said pairs which fulfill the condition that the source reflection factor belonging to the source impedance is equal to the effective input reflection factor, and that the load reflection factor belonging to the load impedance is equal to the complex conjugate of the effective output reflection factor of the considered active component or amplifier circuit, Determination of an ohmic output resistance, effectively active in the considered source impedance and load impedance, as an absolute square of the load impedance, divided by twice the real part of the load impedance, Division of the region from the product of the lower threshold and the effectively active ohmic output resistance to the product of the upper threshold and the effectively active ohmic output resistance into a third number of, for example, equidistant resistance values, For each resistance value from the third number of resistance values, determination of a load reflection factor and a source reflection factor, which fulfill the condition that the source reflection factor is equal to the effective input reflection factor and that a parallel connection of the load resistance, belonging to the load reflection factor, with the output resistance of the considered active component or circuit produces a purely ohmic resistance from the quantity of the resistance value, provided such a load reflection factor/source reflection factor pair exists for this resistance value, Selection of the plurality of load lines as the set of ohmic load lines through the operating point for those effective resistance values from the second number of resistance values for which such load reflection factors and source reflection factors exist, and, if applicable, selection of the load and source impedances in each case belonging to the load lines and operating points as the load and/or source impedances for the load reflection factors and source reflection factors determined above.

Another technically important case, in addition to power matching, is a matching during which the power gain is approximately maximized under the secondary condition "freedom from reflection at input" by output-side matching. This further embodiment determines an approximate operating conditions of an active component or circuit, which maximize the power added efficiency under this boundary condition.

In a further embodiment of the invention, the load lines can be selected, starting from a preselected test voltage, a preselected output voltage range, and a preselected voltage resolution, as well as a preselected output current range and a preselected current resolution, according to the instructions:

Selection of a first set of supporting operating points as a set of all current-voltage pairs with a voltage equal to an integer multiple of a voltage resolution within a preselected output voltage range and a current, which, lying within the preselected output current range, represents an integer multiple of the preselected current resolution, as well as for each of the supporting operating points:

Determination of the effective output impedance of the active element or amplifier circuit under the condition of power matching at the output and a problem-adapted selected matching condition at the input of the active element or amplifier circuit, Determination of a first straight-line slope as the absolute square of the effective output impedance, divided by twice the real part of the effective output impedance, Variation of the first straight-line slope to a varied straight-line slope, and self-consistent determination of a load impedance, at which a parallel connection of, a) first, the effective output impedance of the active electronic component or amplifier circuit at the supporting operating point at a given matching condition at the input of the active component or amplifier circuit, as well as b_second, the load impedance, has a real value equal to the varied straight-line slope, Determination of the course of the power gain along a suitably selected section of the straight line with a varied straight-line slope through the supporting operating point at a load equal to the self-consistently determined load impedance and at the given matching condition at the input of the active element or amplifier circuit, Selection of the largest connected section of the straight line with a varied straight-line slope, said section that contains the supporting operating point and in which the power gain in the self-consistently determined load impedance, as well as the source impedance determined from the matching condition at the input at the supporting operating point has at most a predefined variation, as well as the selection of a new course of the power gain as the limit of the course of the power gain in the section, Selection of the load impedance determined from the self-consistently determined load impedances for the varied straight-line slopes, said impedances at which the new course of the power gain has the lowest deviation from a symmetric or other desired course, Selection of the straight line with a varied straight-line slope through the supporting operating point as a load line through the supporting operating point.

Of course, any resolution with which in particular an optimized operating point is estimated can be achieved by iteration of the method of the invention, for example, in the present further embodiment with suitable matching of the preselected output voltage range and/or output current range in a numerically efficient manner.

The slope in the present power matching at the output and suitably selected conditions at the input of an active element generally depends on the position in the output characteristic field.

In particular, in large-signal operation, the output of an active element moves precisely on a resistance line around an operating point A only in cases of exception also at large deflections.

The slope changes continuously, however, during the crossing of the output characteristic field, so that the value of the slope at a second point in the output characteristic field can be estimated in a first approximation by the value of the slope at a first point, particularly, if the first and second point lie suitably "close to one another" in the output characteristic field. The following therefore emerges as a theoretical construct for the validation of the employed approach from the fact that the output of an active element during the present power matching and deflection around an operating point in sufficient approximation moves on a straight-line segment with a slope through the operating point. Within the scope of the approximation of the output characteristic by the straight-line section, the power gain at a position along the load line can be equated with the maximum power gain achievable at this position.

Two cases can be differentiated in regard to the relationship between an isohypse of a constant maximum power gain through the operating point and the straight-line segment. The straight-line segment can intersect or touch the isohypse.

In the case of an intersection between the straight-line segment and the isohypse, the deflection-dependent power gain (which is equated with the maximum achievable power gain in each case) during deflections up to higher voltages does not behave symmetrically to the deflections to lower voltages. As a direct result of the non-vanishing linear Taylor component of the power gain at the operating point, during a sinusoidal excitation with an excitation frequency at the input of the active element a non-vanishing Fourier component of the signal arises at the output for the double excitation frequency.

However, if the straight-line segment touches the isohypse, the linear Taylor component of the power gain at the operating point vanishes, and the output signal has (apart from the excitation frequency itself) only the higher harmonic of the excitation frequency. Operating points at which the straight-line segment touches the isohypse of the constant maximum power gain through the operating point thereby promise a lower distortion than operating points at which the straight-line segment through the operating point intersects the isohypse of the constant maximum power gain.

Whereas the deviation of the output signal from a sinusoidal course during harmonic excitation at the input can be precisely quantified by the "distortion factor" THD (total harmonic distortion), it has emerged in practice that for the majority of operating conditions of many active elements, linearity properties can be estimated with sufficient accuracy with the use of a quantity readily accessible to simulation, the compression power quantifiable, for example, by the 1-dB compression point, $P_{-1dB}$. The 1-dB compression point $P_{-1dB}$, at a deflection around an operating point, indicates the output power at which the integral power gain has declined by 1 dB from the small-signal value at the operating point.

At an extremum of the power gain along a straight-line segment, an isohypse touches a constant power gain of the straight-line segment. The described method accordingly allows the determination in particular at first of operating points at which the straight-line segments touch the isohypses through the specific operating points; accordingly, thus, a vanishing Fourier component of the output signal at the double frequency of a sinusoidal input excitation can be expected; furthermore, by virtue of the approximations "replacement of the actual load line by the straight-line segment" and "replacement of the actual power gain at a point along the straight-line segment by the maximum power gain achievable at this point," deflections around the operating points are estimated, which lead to a compression of the integral power gain by 1 dB.

Furthermore, the power added efficiencies achievable at the 1-dB compression at the operating points, as well as the operating points with the maximum power added efficiency, and thereby at a given power added efficiency of the lowest possible distortion, are estimated.

Distortion factor-optimized and/or power added efficiency-optimized operating points of active electronic components or circuits can be estimated in this way in a numerically simple manner.

An again different aspect of the invention is an electronic data processing device with a display device for a graphic display, which is designed and equipped to carry out a previously explained method.

The method of the invention for support during circuit design will be explained below with the use of two practical examples and with the aid of several figures. In both examples, the object is to optimize the power added efficiency (PAE) of a linear 5-GHz output driver with an operating voltage of 3.4 V for mobile wireless LAN operation. The first example deals with a single-ended topology (FIG. 1a, b, c) at first still without the process steps essential to the invention. In the second example, the method of the invention is illustrated based on a differential circuit topology (FIG. 2 to FIG. 4).

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

"Mobile operation" means in particular a changing environment. In particular, metal objects in the vicinity of a transmitting antenna can seriously interfere with the antenna matching. Hereby, the reflection factor of the antenna shifts. In order to be able to assure stable operation of the transmitting unit in a changing environment, it is necessary that the output driver works independently of the load in the passive region of the Smith chart. In this case, the term conditional stability is used. Rollet's stability factor k is commonly used as the parameter for unconditional stability; if it assumes a value greater than 1 at an operating point and at a given frequency, the considered component is unconditionally stable at this operating point and at this frequency.

If an output stage at the considered frequency is unconditionally stable but oscillatory at another frequency and given terminal conditions, infinitesimal disturbances, such as, for example, noise, with a frequency portion at the other frequency, are sufficient to cause the output stage to oscillate at the other frequency. In order to be able to assure stable operation under all circumstances, unconditional stability at the operating point and for all frequencies is to be required. In order to analyze the fulfillment of this requirement, generally the frequency response of Rollet's stability factor k is graphically depicted at the operating point.

Figure 1A:
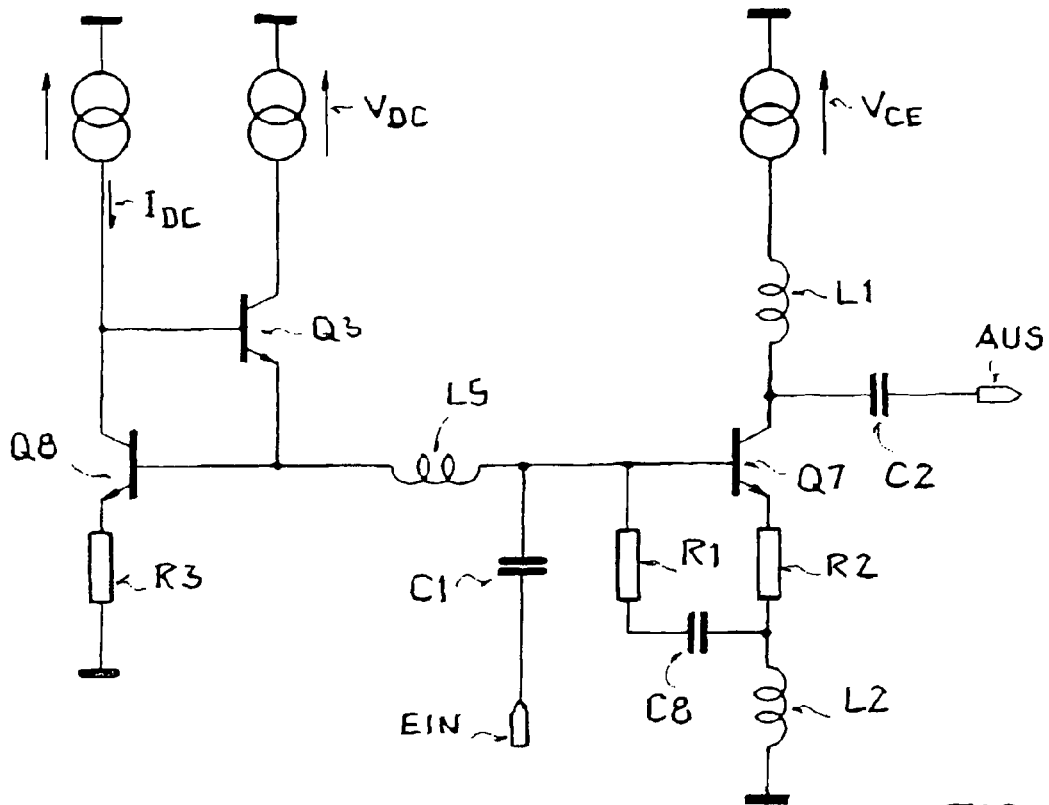
FIG. 1a is a first, nonsymmetric amplifier circuit.

FIG. 1a shows a circuit, as is suitable for high-frequency applications: A nonsymmetric (single-ended) output driver for 5 GHz at a supply voltage of 3.4 V is shown. Here, transistors Q3 and Q8 together with the current source $I_{DC}$ and the voltage source $V_{DC}$ serve to establish an operating point, which can be varied by setting the current source $I_{DC}$ and the voltage source $V_{DC}$. These components are decoupled for high frequencies in the range of 5 GHz by inductor L5, for example, a coil.

The signal source IN is connected via a capacitor C1, for example, a disc capacitor, to the base of a transistor Q7, a high-frequency bipolar transistor. A voltage source $V_{CE}$ for setting the collector-emitter voltage is connected via inductor L1 to the collector of transistor Q7. Inductor L1 is also used for the decoupling of the power supply from the high frequency. Furthermore, the collector of high-frequency bipolar transistor Q7 is connected to the output connection OUT via a capacitor C2. The one pole of a stabilizing emitter-series resistor R2, whose second pole is connected to ground via inductor L2, is connected directly to the emitter of transistor Q7. Furthermore, a feedback branch of capacitor C8 in series with another resistor R1 connects the second pole of the emitter-series resistor R2 to the base of high-frequency bipolar transistor Q7.

The maximum thermal power dissipation, declining across the component, is specified as 550 mW; therefore, the component is supplied with sufficient reliability at a 3.4-V supply voltage preferably with a current of about 120 mA (3.4 V×120 mA=410 mW=0.75×550 mW).

Figure 1B:
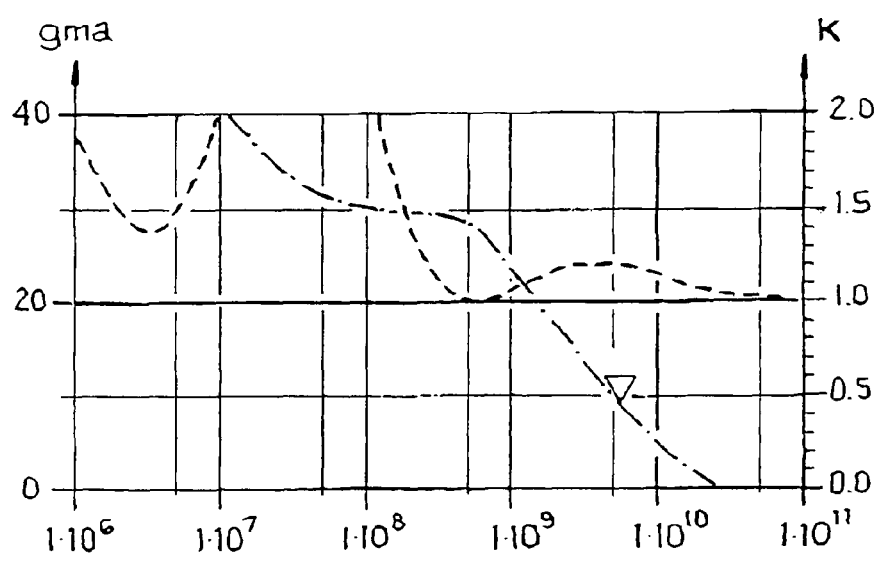
FIG. 1b illustrates curves of parameters of the first amplifier circuit.

FIG. 1b shows, with a dashed line, a frequency response of Rollet's stability factor k at operating point 3.4 V/120 mA and, with the dot-dashed line, the response of the maximum power gain. The maximum power gain at the operating frequency is marked by a triangle. The considered circuit appears to be unconditionally stable for all frequencies according to this plot.

Figure 1C:
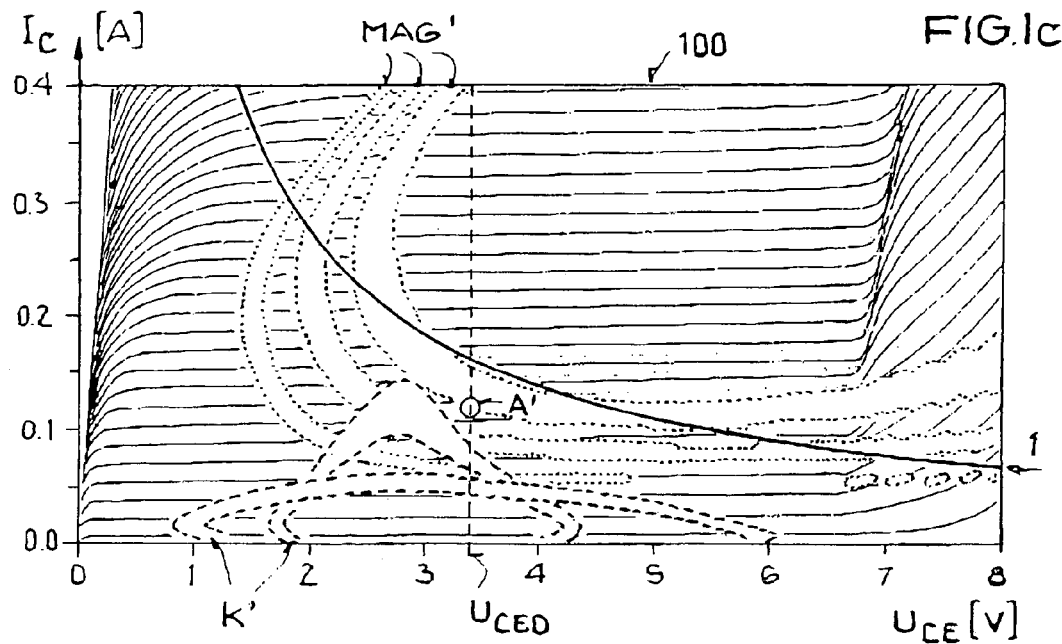
FIG. 1c shows an output characteristic field of the first amplifier circuit.

FIG. 1c shows an output characteristic field 100 of the circuit of FIG. 1a, with a presentation of the collector-emitter voltage ($U_{CE}$) of transistor Q7 as the ordinate and a presentation of the collector current ($I_C$) of transistor Q7 as the abscissa (thin lines). Furthermore, the locus 1 of the maximum power declining across the component and the desired operating voltage 3.4 V ($U_{CE0}$) are shown along with the projected operating point A at 120 mA.

FIG. 1c shows an output characteristic field without the advantageous process features to be discussed below. Here, regions (MAG') of an approximately constant maximum power gain at the operating frequency of 5 GHz are drawn surrounded with a dotted line, and regions (k'), in which Rollet's stability factor is approximately equal to 1 at the frequencies of 0.5 GHz or 1 GHz, surrounded with a dashed line.

In the course of design optimization of the present circuit, it can be derived first from the drawing of FIG. 1c that the operating point A' with a 120-mA collector current $I_{C0}$ is well selected in terms of maximum power gain G. Second, FIG. 1c shows with the plot of Rollet's stability factor k' for different frequencies that even low fluctuations in the supply voltage $V_{CE0}$ are sufficient for the considered circuit to leave the unconditionally stable region.

Figure 2A:
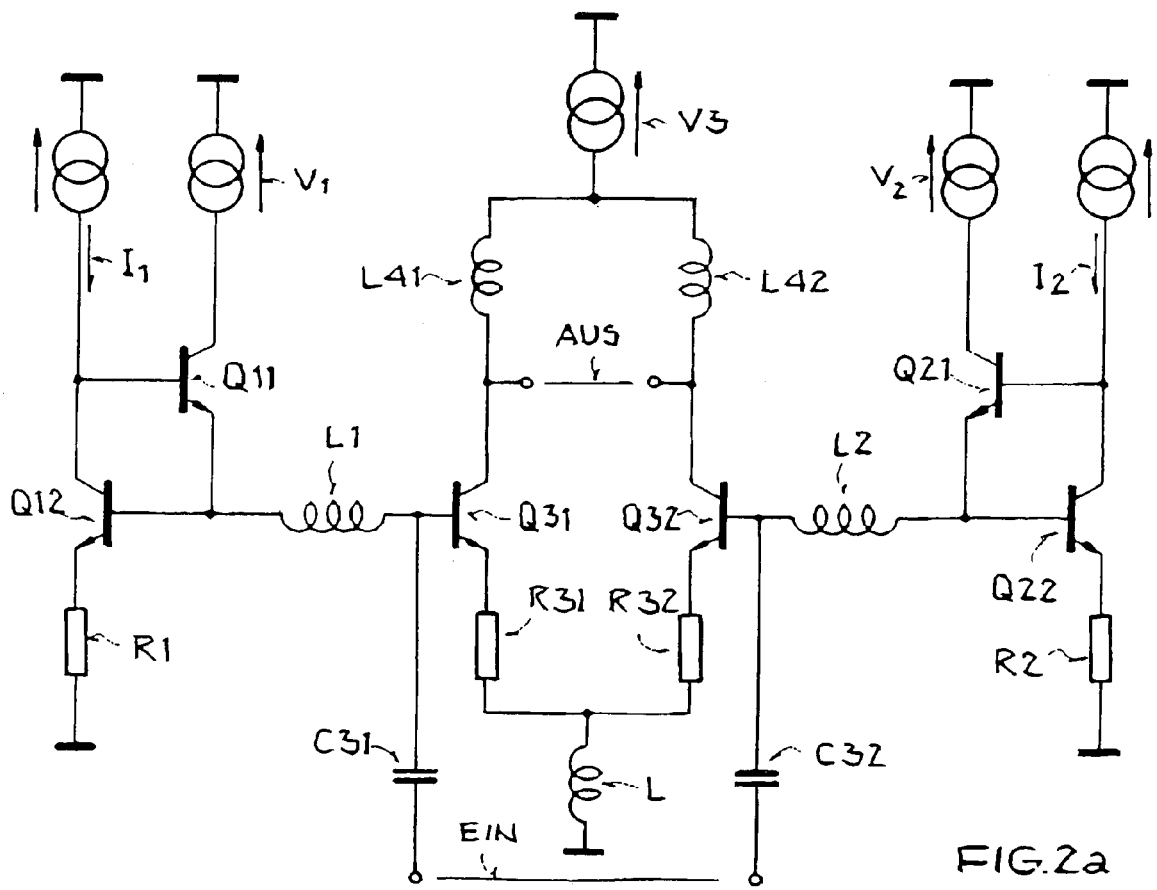
FIG. 2a is a second, symmetric amplifier circuit.

In the second example, an operating point optimal with respect to the maximum power added efficiency is sought for the symmetric circuit shown in FIG. 2a. Here, components I1, V1, Q11, Q12, L1, L2, R1, R2, Q21, Q22, V2, and I2 are used to set the operating point and are not explained further below. The symmetric signal input IN is connected via the two capacitors C31 and C32 to the respective bases of the two high-frequency bipolar transistors Q31 and Q32. The collector connections of the two high-frequency transistors Q31 and Q32 are connected to the symmetric signal output OUT of the circuit and additional components for setting the operating points L41, L42, and V3.

Figure 2B:
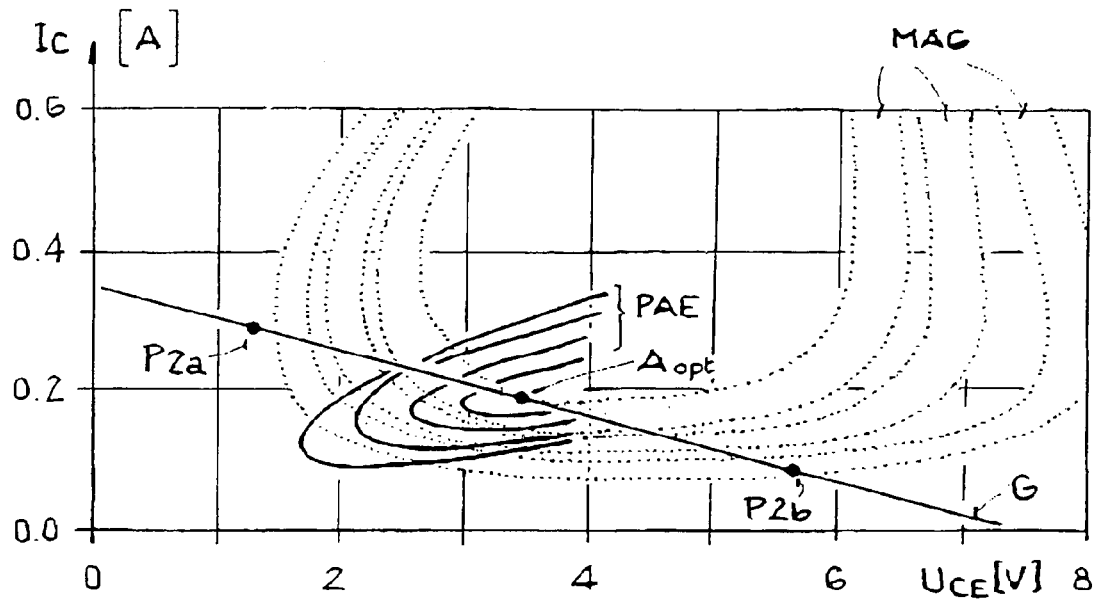
FIGS. 2b and 2c show output characteristic fields of the second amplifier circuit.

In FIG. 2b, parameters of the circuit of FIG. 2a are plotted horizontally versus the DC collector-emitter voltage $V_{CE}$ of transistors Q31 and Q32 and vertically versus the DC collector current of these transistors. First, regions of the approximately constant maximum power gain MAG at the operating frequency of 5 GHz are shown as dotted lines. Two neighboring regions differ here by 1 dB on average in maximum power gain.

Moreover, FIG. 2b shows the courses of individual isohypses, estimated with the aid of a method of the invention, of the power added efficiency, PAE, at the 1-dB compression point $P_{-1dB}$.

Finally, in FIG. 2b a PAE-optimal operating point $A_{opt}$ and a PAE-optimal load line G are drawn with the limits P2a and P2b of a region in which the maximum power gain deviates by at most 3 dB from its maximum.

The essence of the method of the invention, automated with the use of electronic data processing means, will be described below with the use of a simple graphic implementation. This implementation is based on an output characteristic field with drawn isohypses or isohypsic regions of the maximum power gain.

In a simple embodiment of the solution of the invention, a plurality of straight-line segments are drawn in the output characteristic field. With the aid of the isohypses of the maximum power gain, a point at which the maximum power gain assumes its maximum value on the specific straight-line segment is estimated along each of these straight-line segments. At this point, the specific straight-line segment touches one of the isohypses.

Next, proceeding from the point of the highest maximum power gain in both directions along the straight-line segment, sections are measured off in such a way that the endpoints of the sections lie on isohypses for a 3 dB lower maximum power gain than the highest value of the maximum power gain.

In an embodiment of the method, the midpoint between these two endpoints is used as the estimated value for an operating point, which permits the highest power added efficiency along the specific straight-line section, and the highest power added efficiency is estimated from a deflection around the midpoint up to both endpoints.

In a further embodiment of the method, the point of the highest maximum power gain is used as the estimated value for an operating point, which permits the highest power added efficiency along the specific straight-line section, and the highest power added efficiency is estimated from a deflection around the midpoint up to the endpoint of the two endpoints that is closer to the estimated operating point.

In high-frequency electronics, the 1-dB compression point $P_{-1dB}$ has taken root as a measure, relatively simple to define, for the quantity of the linear gain region. This is a relatively rough but pragmatic approach to the distortion by a component.

Within the scope of the two described graphic methods, at first the course of the power gain along a load line is first approximated by the course of the maximum power gain along the load line: Whereas at any operating point for a large portion of the possible output reflection factors, the absolute value of the power gain deviates greatly from the maximum possible value, the experiment shows that the relative course of the local power gain along a curve in the output characteristic field depends only little on the output reflection factor. To obtain information on the change in the power gain along a curve in the output characteristic field, this is approximated by the change in the maximum power gain.

Within the scope of the two described graphic methods, the actual course of a load line is further approximated by a straight-line section.

Within the scope of the two described graphic methods to determine operating points of the maximum power added efficiency, third, the 1-dB compression point is estimated by assuming that the integral power gain has decreased by about 1 dB, when the local value of the maximum power gain along the approximated load line has decreased by 3 dB.

The layout of electronic circuits frequently requires a weighing of different target parameters to be optimized simultaneously. The present method can be used for this purpose, for example, for optimizing large-signal parameters, which contain different weighted target parameters. In a further embodiment of the method for support in the finding of optimal large-signal operating points with simultaneous optimization of different target parameters, in contrast, after estimation of operating points, optimizing a primary target parameter along individual load lines, in addition to isohypses of the primary target parameter, also courses of other circuit parameters are plotted versus the found optimizing operating points, for example, in the form of isohypses.

This type of an at least approximate determination is far superior in computational effort to a numerically precise calculation according to the state of the art, as is made possible, for example, by the harmonic-balance method.

Figure 2C:
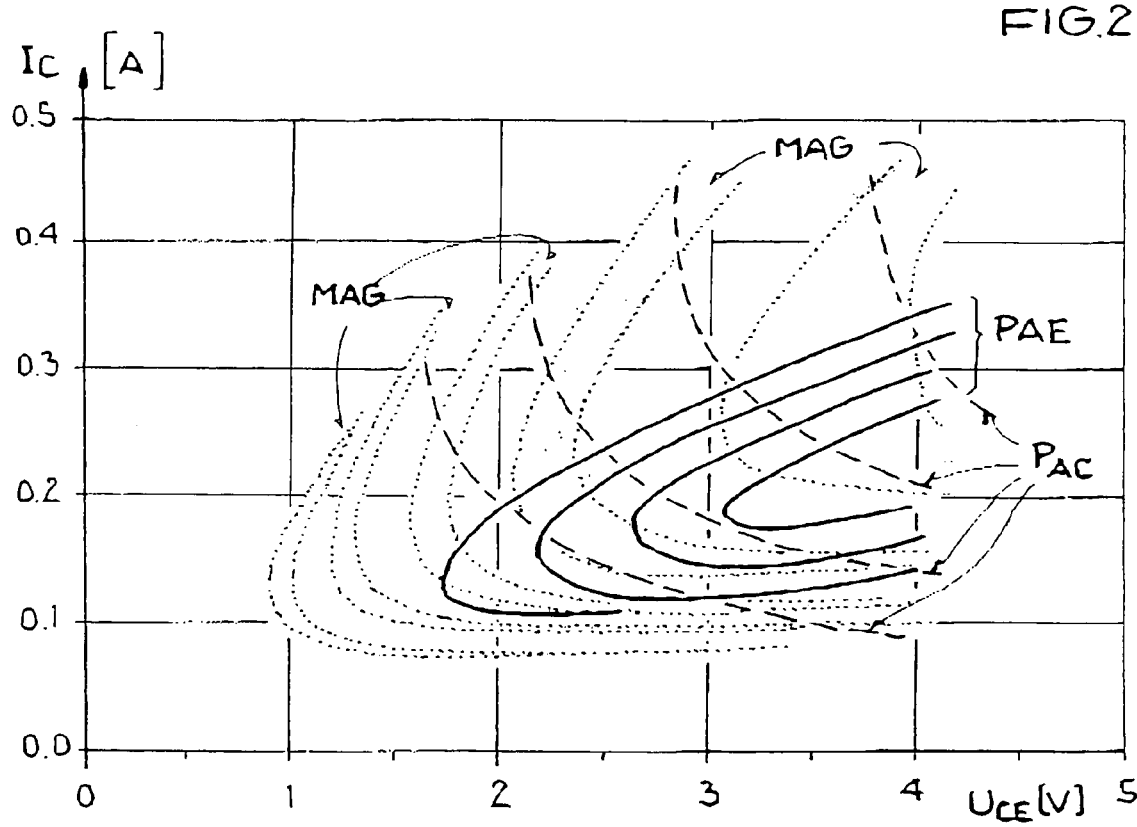

FIG. 2c shows an example of this type of plot for the example of the circuit of FIG. 2a. The DC collector-emitter voltage $V_{CE}$ of transistors Q31 and Q32 is plotted horizontally and the DC collector current vertically. Families of isohypses of the achievable power added efficiency PAE are shown as solid lines and isohypses of the output power $P_{AC}$ as dashed lines; as in FIG. 2b, isohypsic regions of the maximum power gain MAG are delimited by dotted lines.

Two algorithms for the automated estimation of operating points of the power added efficiency are presented below as further exemplary embodiments of the invention.

First Algorithm:

In the following section, an algorithm is described for finding the optimal operating points for an optimal power added efficiency PAE in the implementation in the form of a program, supporting the design of electronic circuits, for an electronic data processing device with use of the circuit example of FIG. 2a.

Proceeding from the circuit depicted in FIG. 2a, an output characteristic field is plotted, which covers the entire allowable current-voltage range. In the example calculated here, the output characteristic field 100 comprises equidistant values of the control current I1 from 0 mA to 800 mA, and 161 equidistant values of the voltage $V_{CE}$ from 0 V to 8 V. At each of these current-voltage points, henceforth the S parameters for a sufficiently dense frequency field are displayed, in the considered example at the frequencies of 100, 200, and 500 MHz and 1, 2, 5, 10, and 20 GHz.

The output characteristic field and S-parameter field can be obtained, for example, from models or measurements. Proceeding from the S-parameter field, the maximum power gain G at the desired operating frequency can now be determined directly. The maximum value, assumed across the considered region of the output characteristic field, of the maximum power gain G at the operating frequency of 5 GHz, called MAGmax hereafter, constitutes 26.1 dB in the considered example. Furthermore, the positions of the points in the output characteristic field can be determined, said positions at which the contribution of the maximum power gain is smaller, for example, by 0.5 dB than this maximum MAGmax. These points in FIG. 2b are given by the interior one of the regions of the approximately constant maximum power gain MAG.

For the further approach, it is necessary to know or establish the expedient highest values for currents and voltages in the component. The expediently highest value of the current, called IBBmax hereafter, is selected in the example as 900 mA as the highest of the current values at the points in the output characteristic field at which the contribution of the maximum power gain is 0.5 dB smaller than the maximum MAGmax, and the advantageously highest value of the voltage, called VCEmax hereafter, as the breakdown voltage at the vanishing current density, namely, 8 V.

So that the algorithm, described below, without use of intellect finds reasonable estimations for the PAE-optimal operating conditions for the circuit depicted in FIG. 2a, it is advantageous furthermore that the output characteristic field for current-voltage values has been plotted up to approximately a point (VCEmax |2*IBBmax). This is fulfilled in the considered example, failing which the output characteristic and S-parameter fields for a matched current region must be plotted and the previously described steps repeated.

For an approximate automatic determination of PAE-optimal operating points, furthermore, a line LL, which is straight in the considered example, between the points (0|0) and (VCEmax|IBBmax) is divided into an expediently selected first number N1 of equidistant operating points A1 to AN1. The quantity of the expedient first number N1 thereby co-determines the smoothness and position resolution of the isohypses, to be determined, of the power added efficiency PAE across the output characteristic field. A usually purposeful value of the expedient first number N1 is, for example, a value of 100.

For an approximate automatic determination of PAE-optimal operating points, furthermore, an expedient second number N2 is selected. The expedient second number N2 is equal to a number of points in the passive region of the load reflection factor level, across which a first evaluation step within the scope of the described algorithm extends. A usually purposeful value of the expedient second number N2 is, for example, a value of 300. In the passive region of the load reflection factor level, a number of load reflection factors R1 to RN2 is now selected approximately uniformly, said number which is equal to the expedient second number N2, for which purpose, for example, the following statement can be used:

A point Rn in the passive region of the load reflection factor level with ordinal number n, the ordinal number n being greater than or equal to 1 and less than or equal to the expedient second number N2, is given by the expression:

$$Rn = \sqrt{\frac{n}{N2}} \exp(\sqrt{-4\pi \cdot n})$$

For each of the load reflection factors R1 to RN2 and for each of the operating points A1 to AN1, the following described approximation method for estimating the powder added efficiency PAE, achievable at the given load reflection factor on a load line passing through the given operating point, is used:

A locus LA in the output characteristic field is selected as the load line LA for the resistive portion of the load, belonging to the considered load reflection factor, through the considered operating point. A problem-adjusted input impedance is selected for the considered load reflection factor. In the case of a power amplifier, this can correspond, for example, to a source reflection factor, which is equal to the complex conjugate of the input reflection factor seen at the considered load reflection factor.

Sufficiently finely positionally resolved and proceeding from or intermediate between points of the output characteristic and S-parameter field, the power gains, belonging to the considered load and source reflection factors, are plotted along this locus LA. The thus found curve of "power gain vs. voltage and current along the locus" LA is called the "gain curve" below.

The position of the maximum of the gain curve is sought (if it is not clear in a preferentially interesting current-voltage range, the gain curve is discarded and another load reflection factor/operating point pair is considered), as well as all positions P1 to Pn along the gain curve, at which the power gain is a fixed fraction of the maximum of the gain curve. For example, a fraction of 0.5 of the maximum of the gain curve, or 3 dB less than the maximum of the gain curve, is expedient for determining the measure "compression point $P_{-1dB}$" of the achievable linear output power.

It is analyzed, furthermore, whether two clearly determined points Pa and Pb exist among the points P1 to Pn, which fulfill the conditions:

point Pa is the point with the highest voltage value from among those of points P1 to Pn with voltage values less than the voltage value at the position of the gain curve maximum, point Pb is the point with the lowest voltage value from among those of points P1 to Pn with voltage values greater than the voltage value at the position of the gain curve maximum, in which case the midpoint of the two points Pa and Pb is used as an estimated value for a reflection factor, to be considered, and for a PAE-optimal operating point, belonging to the considered operating point, failing which, however, a new load line is used.

An eighth of the product of the difference of the current value and the voltage value at the points Pa and Pb is used as the estimated value for the output power at the PAE-optimal operating point found in this way, a fourth of the product of the sums of the current value and voltage value at the points Pa and Pb as the estimated value for the standby power consumption, and the quotient of the output power and the standby power consumption as the estimated value for the achievable power added efficiency PAE, where $I_x$ designates the current and $U_x$ the voltage at point Px:

$$PAE \approx \frac{1}{2} \left| \frac{(I_a - I_b)}{(I_a + I_b)} \frac{(U_a - U_b)}{(U_a + U_b)} \right|.$$

At each of the load reflection factors R1 to RN2, with the aid of the thus described approximation method for estimating the power added efficiency PAE achievable at the given load reflection factor, the power added efficiency PAE is estimated for each of the operating points A1 to AN1, and a suitable statistical measure for a representative value of the thus obtained estimated value for the power added efficiency PAE for the considered load reflection factor is formed.

Mainly at low values of the expedient first number N1, for example, N1=20, the median of the obtained estimated values can be used as the representative value, but also mainly at higher values of the expedient first number N1, for example, N1=100, the mean of the top 25% of the estimated values.

A PAE-optimal load reflection factor is estimated in a next step, with the aid of representative values, determined in this way, for the estimations of the power added efficiency PAE as a function of the load reflection factor. For this purpose, for example, the mean of all load reflection factors can be formed at which the representative values constitute at least 85% of the maximum representative value of the load reflection factors R1 to RN2.

Figure 3A:
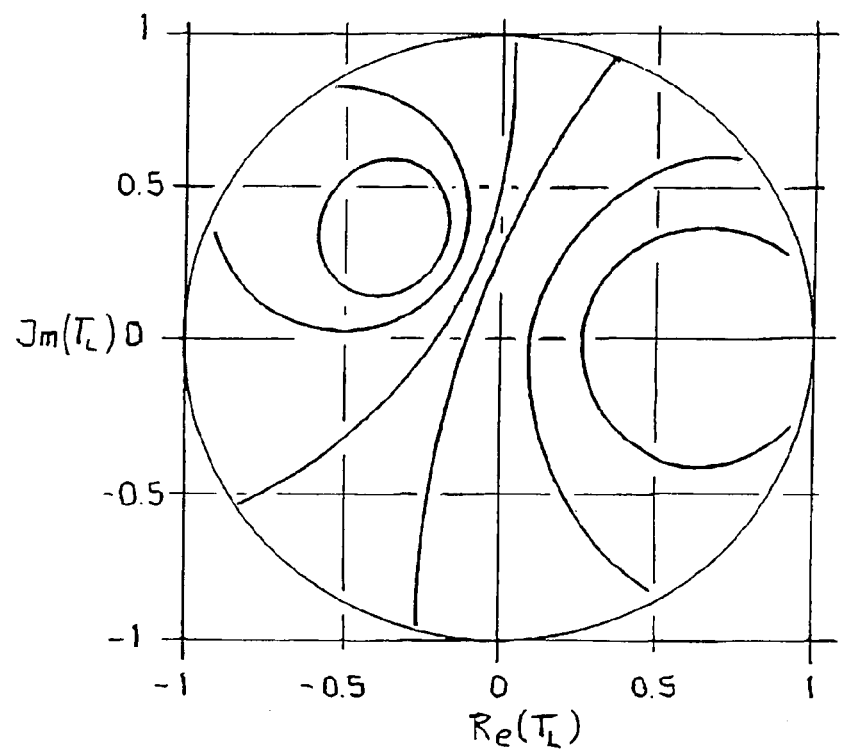
FIGS. 3a and 3b are graphic presentations of electrical parameters of the second amplifier circuit.
Figure 3B:
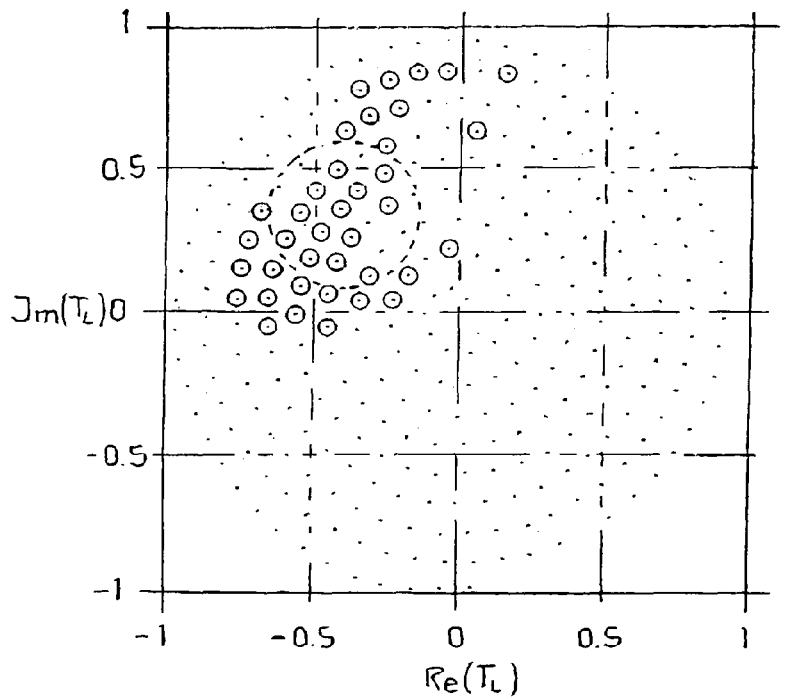

FIG. 3a sketches schematically the course of the found representative values of the power gain PAE for the considered load reflection factors R1 to RN2 in form of contour lines; FIG. 3b shows, for an expedient second number N2 of 300, the position of the considered load reflection factors in the load reflection factor level as points, load reflection factors, at which the representative values constitute more than 85% of the maximum representative value for estimating the power added efficiency PAE, as small circles, as well as the 1-σ region for the indicated mean of load reflection factors surrounded by hatching.

The load, belonging to the found mean of the load reflection factors, as a first approximation $R_{opt,1}$ at a load optimizing the power added efficiency PAE represents a first result of the algorithm of the invention.

Based on the approximation of the true load lines at the given load reflection factors through parts of resistance lines, the dependence of the achievable power added efficiency PAE on the imaginary part of the load reflection factors is hereby less well approximated than the dependence on the real part of the load reflection factors. A more precise estimate of the real part, optimizing the power added efficiency PAE, of the load reflection factor therefore appears to be more useful than a precise estimate of the imaginary part.

In another process step, proceeding from the found first approximation $R_{opt,1}$, a second approximation to the load optimizing the power added efficiency PAE is now calculated.

For this purpose, the approximation method for estimating the power added efficiency PAE, achievable at a given load reflection factor, is used for the expedient first number N1 of operating points A1 to AN1 and the elements of a second set of load reflection factors. The second set of load reflection factors comprises hereby an expedient third number N3 of load reflection factors S1 to SN3. The load, belonging to any load reflection factor Sx with ordinal number x from the second set of load reflection factors S1 to SN3, has the same imaginary part as the first approximation $R_{opt,1}$ to a load optimizing the power added efficiency PAE, and a real part, which intervenes between, for example, the half and the double value of the real part of the first approximation $R_{opt,1}$.

A possible specification for the type of the intervention is, for example, a logarithmic division of the segment between the half and double value of the real part of the first approximation $R_{opt,1}$.

$$\frac{\text{Re}(R_{opt,1})}{2} 4^{\frac{x}{N3}}.$$

Figure 2D:
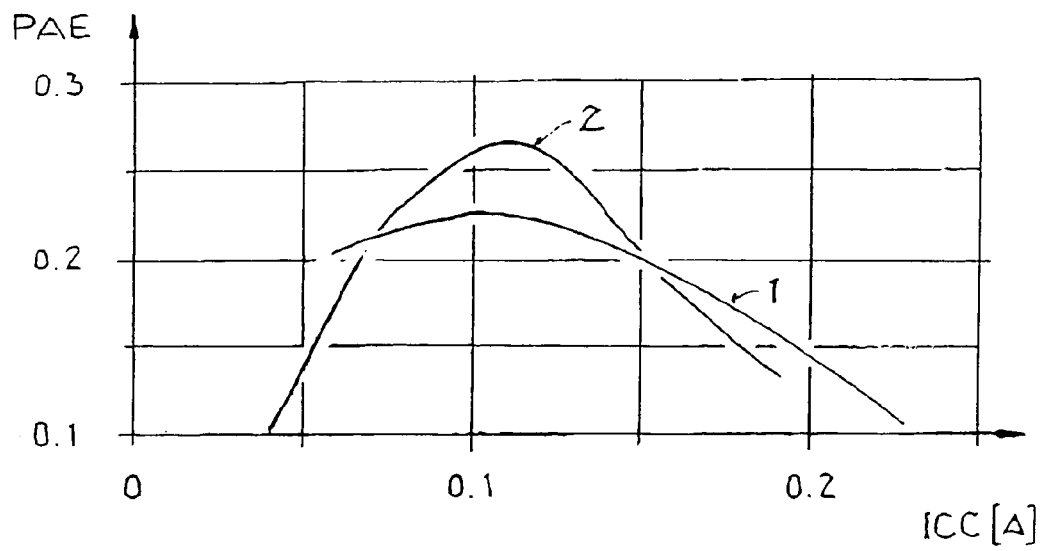
FIG. 2d shows courses of the power added efficiency versus the collector current.

In a last step, the estimated value, obtained with the aid of the approximation method for estimating the power added efficiency PAE achievable at a given load reflection factor, for the estimations, belonging to the second set of load reflection factors and the considered operating points, for the achievable power added efficiencies PAE is first plotted in the output characteristic field versus the associated estimated PAE-optimal operating points, suitably smoothed, and suitably divided into groups:

FIG. 2d shows, plotted versus the collector current, the achievable power added efficiency PAE for the circuit of FIG. 2a at supply voltage values $V_{CE}$ of 3.3 to 3.6 V. Curve 1 here shows the estimate according to the method of the invention, and curve 2 the numerically precise simulation with the use of a transient simulation program for the same operating points. As is evident, the optimal current density is reproduced sufficiently well by the approximation method.

The method of the invention approximates the course of the "true" load characteristic to a "true" load by a load line through the operating point with a slope, which corresponds to the real part of the "true" load. This approximation is satisfied sufficiently well at least in the design of a low-distortion amplifier.

Furthermore, the course of the "true" gain along the "true" load line is replaced by a course of the small-signal gain along the straight load lines. The "true" gain at a given deflection around an operating point results as a mean of small-signal gains along the associated load line. The course of the small-signal gain is maximally flat in the vicinity of the point of the small-signal gain maximum. The modulation, for example, belonging to a compression of the power gain of, on average, 1 dB, around the point of the small-signal gain maximum can be estimated with the aid of current values and voltage values along the straight load lines, with which the gain is reduced by, for example, 3 dB of the maximum value.

In this manner, approximation values for the 1 dB-compression point can be obtained in a numerically very simple way from the small-signal parameters of the considered circuit or the considered component. Moreover, a set of small-signal parameters during an application of the method of the invention need only be determined a single time.

In the same manner, of course, other large-signal parameters, particularly the third-order intermodulation product, IP3, can also be estimated in an elegant and numerically efficient way, proceeding from small-signal parameters.

An independently proceeding process sequence for an electronic data processing device is simultaneously provided with this practical exemplary embodiment. This is used to provide support in the approximate determination of the maximum power added efficiency, PAE, of an electronic component or circuit, for the approximate finding of operating points of an electronic component or circuit, by operation at said operating points the achievable power added efficiency, PAE, of the component or circuit is maximized, and for the approximate determination of terminal impedances, by wiring with said terminal impedances the power added efficiency, PAE, of the component or circuit at the named operating points is maximized.

Another aspect of the present invention accordingly relates to the provision of an electronic data processing device supporting the drafting of electronic circuits.

In the practical present exemplary embodiment, the starting point is an estimation of a maximum current with which the active component or active circuit is to be reasonably supplied, as well as the maximum allowable reverse voltage, which decreases across the active component or circuit, said estimation which automatically provides the aid supporting the designer by the supplied method.

The previously described practical exemplary embodiment shows an algorithm for finding optimal operating points of active components for use particularly in high-frequency circuits, as well as an electronic data processing device supporting the design of electronic circuits.

Second Algorithm:

As in the previous example, it is also the case here to maximize the power added efficiency, under the given connection conditions at the input of an amplifier circuit. For this purpose, an optimal operating point is to be established along with the associated terminal conditions at the output of the amplifier circuit.

Figure 4:
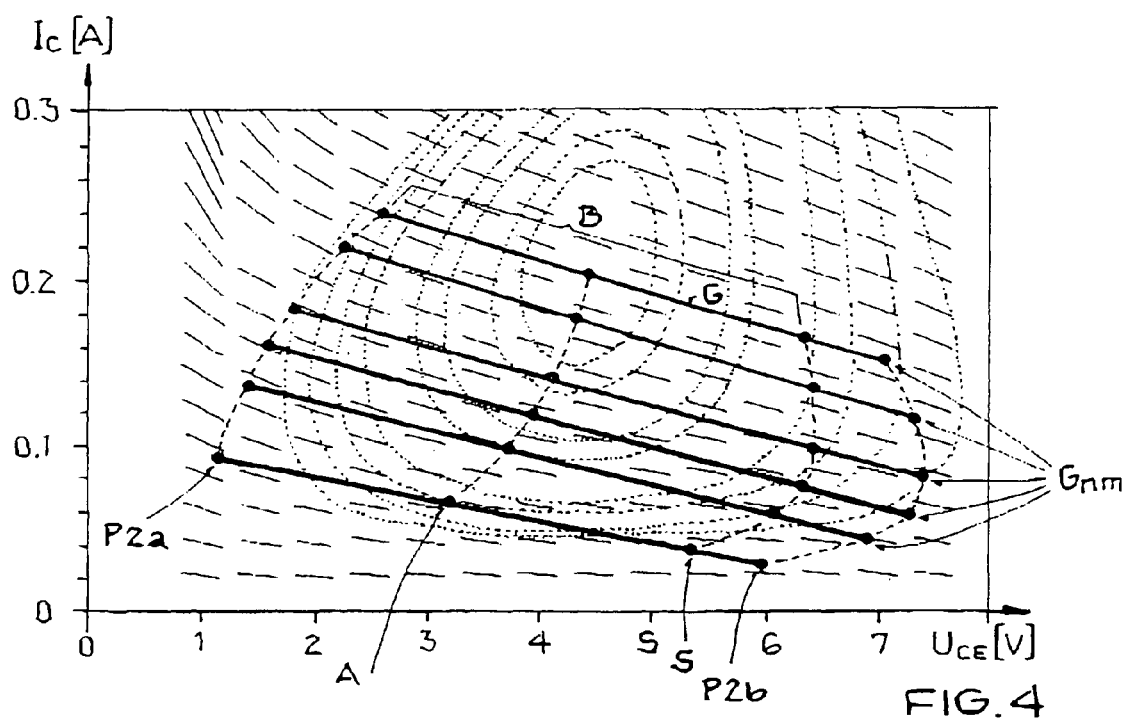
FIG. 4 shows an output characteristic field of an active component.

The procedure in this second, especially explained exemplary embodiment of the method of the invention is shown with the aid of FIG. 4. FIG. 4 again shows an output characteristic field of the circuit of FIG. 2a, in which the output voltage is plotted horizontally and the output current vertically. As in the previous output characteristic fields, isohypsic regions of the maximum achievable power gain are shown by dotted lines.

One of the criteria, which are to be met for a maximum power transfer to the load and accordingly maximum power added efficiency, is the vanishing of the reactive power at the amplifier output. For this purpose, the parallel connection of the output impedance of the amplifier with the input impedance of the effective load must be real, so that the output moves at least locally on a straight ohmic load line.

The requirement of maximum power gain and a given matching condition at the input establishes the input impedance of the effective load and also the output impedance of the amplifier circuit, so that the local slope of the straight load lines can be determined. These slopes at the possible operating points, at least with sufficiently small deflections around the standby position, represent a tangent field at the power-matched load lines. A resulting first condition for a possible load line, optimizing the power added efficiency with load matching, is that the slope of the load line at the operating point must correspond to the slope of the tangent field.

This first condition, which is advantageously utilized in an exemplary embodiment of the method of the invention, is published for the first time in the present protective publication; the tangent field is presented in the output diagram of FIG. 4 with the aid of light straight-line segments.

Under the operating conditions of maximum power added efficiency, operating conditions, which minimize the distortion of a circuit, are especially excellent. A criterion, also presented for the first time in the present protective publication, for operating conditions of this type is the vanishing of the first derivation of the course of the small-signal-power gain at the operating point. The fact that the load lines at the operating point must touch isohypses of the maximum achievable power gain emerges as a second condition for a possible load line or load line family optimizing the power added efficiency.

For each isohypse of the power gain, in the simplest case, there are only two distinguished operating points at which both conditions can be fulfilled simultaneously. By way of example, such individual distinguished operating points are marked by small round disks in FIG. 4 and connected with one another by means of a dashed line labeled "A." A plurality Gnm of approximations of load lines, optimizing the power added efficiency, are shown as thick lines, for example, the approximation labeled "G" through the distinguished operating points.

Additional distinguished points along the approximate load lines are the upper and lower boundary points of the sections of the approximate load lines, in which the maximum achievable power gain deviates by less than 3 dB from the maximum along the approximate load lines, said points marked by small round disks and connected together by a dashed line (P2a, P2b).

During the, in the ideal case, distortion-free operation, the energy contribution, which is necessary for deflection of the circuit from one of the distinguished operating points to the associated upper boundary point, does not differ from a same contribution for deflection to the lower boundary point. Because by virtue of construction the thick load lines in FIG. 4 allow a low-distortion operation, it is assumed as a further approximation that upward and downward deflection around the distinguished operating points along the load lines occurs symmetrically. The regions of each load line of the method of the invention in this second exemplary embodiment are accordingly assumed to be the largest load line subsets, placed symmetrically around a distinguished operating point in each case. They extend in FIG. 4 from the boundary points on lines P2a to the load line points lying on the dashed line S and marked by the small round disks; this type of subregion of the exemplary load line G is designated as "B" in FIG. 4.

The power added efficiencies, belonging to the distinguished operating points, are finally estimated from the position of the operating points and the expansion of the named regions, for example, according to the abovedescribed further embodiment of the method. The operating point of all distinguished operating points that is assigned the highest power added efficiency in this manner is taken as the estimated value for the operating point optimizing said efficiency. The present method of this exemplary embodiment permits in a simple manner an approximate determination of the optimal operating conditions with all operating points and connection conditions.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

Further, many embodiments are described in terms of sequences of actions to be performed by, for example, elements of a computing device. It will be recognized that various actions described herein can be performed by specific circuits (e.g., application specific integrated circuits (Asics)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

What is claimed is:

1. A method for manufacturing a high-frequency circuit, the method comprising:
   providing an active component having an input and an output;
   selecting a first set containing a first number of supporting operating points;
   determining for each supporting operating point a second set of output impedances at the output of the active component;
   determining for each supporting operating point and for each output impedance a source impedance at the input of the active component;
   determining at least one load line at each supporting operating point for each output impedance;
   measuring a small-signal parameter at the input and the output of the active component;
   determining a course of the measured small-signal parameter along each load line;
   determining a region of each load line as a load line subset, distinguished by a characteristic property dependent on the small-signal parameter;
   determining a large-signal parameter value, via a computer having a processor and a memory, assigned to the supporting operating point and the output impedance and the source impedance and the load line, from the course of the small-signal parameter within the region, wherein the large-signal parameter value is determined from averaging the small-signal parameter along the load line within the region; and
   selecting and integrating additional components into the high-frequency circuit, the additional components defining an operating point of the active component based on the determined large-signal parameter value such that the high frequency circuit is stabilized.

2. The method according to claim 1, wherein the plurality of load lines is determined by selecting a first set, containing a first number of supporting operating points, and each supporting operating point being assigned a second set containing a second number of load lines.

3. The method according to claim 2, wherein the plurality of load lines are determined by determining at each supporting operating point a straight line slope, and selecting a load line as a straight line with the determined straight line slope through the supporting operating point, and assigning each load line the complex conjugate of the effective output impedance as the load impedance.

4. The method according to claim 2, wherein the first set of supporting operating points is formed according to the instructions which include:
   selecting a first number;
   selecting a first point;
   selecting a second point in the output characteristic field of a considered component or amplifier circuit;
   selecting a segment between the first point and the second point in the output characteristic field;
   dividing the segment into a first number of first points; and
   selecting the totality of the first points as the first set of supported operating points.

5. The method according to claim 4, wherein a second set of load impedances is formed according to the instructions which include:
   selecting a second number;
   selecting a second number of load reflection factors;
   determining a load impedance, belonging to a load reflection factor, from the second number of load reflection factors; and
   selecting the totality of the second number of the load impedances belonging to one of the load reflection factors as the second set of load impedances.

6. The method according to claim 5, wherein the selection of the set of ohmic load lines through the operating point occurs at an ohmic part of any factor from the second number of load reflection factors, and at an input impedance expedient at the given operating point and the given load impedance.

7. The method according to claim 1, wherein the plurality of load lines are determined by:
   determining a first set of supporting operating points;
   determining, at each supporting operating point, an effective output impedance for a given matching condition at the input;
   determining, at each supporting operating point, a straight-line slope which is an absolute square of the effective output impedance, divided by twice the real part of the effective output impedance;
   determining, at each supporting operating point, a varied straight-line slope by self-consistently determining a load impedance in such a way that a parallel connection includes, the effective output impedance of the active component at the supporting operating point at a given matching condition at the input of the active component, and the load impedance, which has a real value equal to the varied straight-line slope;
   selecting a load line as a straight line with the varied straight-line slope through the supporting operating point; and
   assigning each load line the self-consistently determined load impedance as the output impedance.

8. The method according to claim 7, wherein the variation of the straight-line slope occurs so that the straight-line slope at which the region has the greatest expansion is selected as the varied straight-line slope.

9. The method according to claim 1, wherein input and/or output impedances at the supporting operating point fulfill at least one of the following conditions:
   an achievable power gain is maximized for the input and/or output impedances;
   a stable achievable power gain is maximized for the input and/or output impedances;
   the achievable power gain is maximized for the input and/or output impedances with freedom from reflection at the input;
   the stable achievable power gain is maximized for the input and/or output impedances with freedom from reflection at the input;
   the achievable power gain is maximized for the input and/or output impedances with minimization of the noise ratio; or
   the stable achievable power gain is maximized for the input and/or output impedances with minimization of the noise ratio.

10. The method according to claim 1 wherein the region of each load line is determined depending on a significant value.

11. The method according to claim 10 wherein the region is determined as a subset of the load line at the value of the small-signal parameter that deviates from the local extremum by no more than a defined factor.

12. The method according to claim 1, wherein an operating point is determined within the region.

13. The method according to claim 1, wherein at least one determined value of the large-signal parameter is graphically presented versus the voltage and the current at an assigned operating point in the form of isohypses of the determined value of the large-signal parameter relative to the operating point.

14. The method according to claim 1, wherein a source/load impedance pair is determined, and wherein the power added efficiency for an approximately determined operating point is approximately optimized in the determination.

15. The method at least according to claim 14, which further includes determining additional values associated with the determined operating points for the approximately maximized power added efficiency within the specific regions and the estimated source/load impedance pairs for the approximately maximized power gain efficiencies at the operating points.

16. The method according to claim 1,
wherein a selection of an input impedance, expedient at the considered load impedance and the considered operating point, as the input impedance that corresponds to a source reflection factor, which represents the complex conjugate of the input reflection factor seen at the considered load impedance and the considered operating point at the input of the active component or amplifier circuit, and/or
wherein a selection of an input impedance, expedient at the considered load impedance and the considered operating point, as the input impedance that corresponds to a source reflection factor, which is equal to the input reflection factor seen at the considered load impedance and the considered operating point at the input of the active component or amplifier circuit, and/or
wherein a selection of an input impedance, expedient at the considered load impedance and the considered operating point, as the input impedance at which the noise ratio of the active component or amplifier circuit is minimized.

17. The method according to claim 1, wherein a selection of a second number of load reflection factors in such a way that a load reflection factor with an ordinal number is selected as the product of the root of the quotient of the ordinal number and the second number and the root, exponentiated to the base of Euler's number e, of the negative of the product of four times the circle constant $\pi$ and the ordinal number, and for each natural number smaller than the second number or equal to the second number as an ordinal number.

18. The method according to claim 1, wherein the plurality of load lines for operating points, at which the active component or the amplifier circuit is unconditionally stable at the considered frequency, is selected according to the instructions which include:
selecting a third number, and a lower and upper threshold;
determining an ohmic part of the effective output resistance, active at the load and source impedances maximizing the power gain, as an absolute square of the load impedance maximizing the power gain, divided by the double real part of the load impedance maximizing the power gain;
dividing the region from the product of the lower threshold and active ohmic part of the effective output resistance to the product of the upper threshold and effective ohmic part of the effective output resistance into a third number of resistance values, for each resistance value from the third number of resistance values;
determining a load reflection factor and a source reflection factor, which fulfill the condition that the source reflection factor is the complex conjugate of the effective input reflection factor and that a parallel connection of the load resistance, belonging to the load reflection factor, with the output resistance of the considered active component or circuit produces a purely ohmic resistance from the quantity of the resistance value, provided such a load reflection factor/source reflection factor pair exists for this resistance value; or
selecting the plurality (Gnm) of load lines (G) as the set of ohmic load lines (G) through the operating point depending on effective resistance values from the third number of resistance values for which such load reflection factors and source reflection factors exist.

19. The method according to claim 1, wherein the active component is a high-frequency bi-polar transistor, wherein an input of the high-frequency circuit is connectable to the base of the transistor, and wherein an output of the high-frequency circuit is connectable to the collector of the transistor.

20. The method according to claim 1, wherein the additional components include at least one capacitor or resistor or inductor or current source or voltage source.

21. A method for manufacturing a high-frequency circuit, the method comprising:
providing an active component having an input and an output;
determining a plurality of load lines;
measuring a small-signal parameter at the input and the output of the active component;
determining a course of the measured small-signal parameter along each load line;
determining a region of each load line as a load line subset, distinguished by a characteristic property dependent on the small-signal parameter; and
determining a large-signal parameter value, via a computer having a processor and a memory, assigned to the load line, from the course of the small-signal parameter within the region,
wherein an estimation of the power added efficiency depends on operating points for the maximized power added efficiency along a region of the load line, and a load line in regard to the expansion of the connected region, and the position of the operating point occurs according to instructions which include:
selecting a first boundary point for which the square of the difference between a current at the second operating point and a current at one of the points of the connected region with a higher current than the current at the second operating point is maximized;
selecting a second boundary point for which the square of the difference between the current at the second operating point and the current at one of the points of the connected region with a lower current than the current at the second operating point is maximized;
estimating the power added efficiency with consideration of the expansion of the connected region and the position of the second operating point as half of the absolute value of the product of, first, the quotient of the difference and the sum of the voltage values at the two boundary points, and, second, the quotient of the difference and the sum of the current values at the two boundary points; and
selecting and integrating additional components into the high-frequency circuit, the additional components defining an operating point of the active component based on the determined large-signal parameter value such that the high frequency circuit is stabilized.

22. A method for manufacturing a high-frequency circuit, the method comprising:

providing an active component having an input and an output;

selecting a first set containing a first number of supporting operating points;

determining for each supporting operating point a second set of load impedances at the output of the active component;

determining for each supporting operating point and for each load impedance a source impedance at the input of the active component;

determining at least one load line at each supporting operating point for each load impedance;

measuring S-parameters at the input and the output of the active component;

determining a course of a small-signal parameter along each load line from the measured S-parameters;

determining a region of each load line as a load line subset, distinguished by a characteristic property dependent on the small-signal parameter;

determining a large-signal parameter value, via a computer having a processor and a memory, assigned to the supporting operating point and the load impedance and the source impedance and the load line, from the course of the small-signal parameter within the region, wherein the large-signal parameter value is determined from averaging the small-signal parameter along the load line within the region; and selecting and integrating additional components into the high-frequency circuit, the additional components defining an operating point of the active component and the load impedance and the source impedance based on one of the determined large-signal parameter values such that the active component operates with the one large-signal parameter value.

* * * * *